United States Patent
Rodov et al.

(10) Patent No.: US 6,853,036 B1
(45) Date of Patent: Feb. 8, 2005

(54) METHOD AND APPARATUS FOR PREVENTING MICROCIRCUIT DYNAMIC THERMO-MECHANICAL DAMAGE DURING AN ESD EVENT

(75) Inventors: Vladimir Rodov, Redondo Beach, CA (US); Wlodzimierz Woytek Tworzydlo, Austin, TX (US)

(73) Assignee: ESD Pulse, Inc., Redondo Beach, CA (US)

( * ) Notice: Subject to any disclaimer, the term of this patent is extended or adjusted under 35 U.S.C. 154(b) by 0 days.

(21) Appl. No.: 10/635,390

(22) Filed: Aug. 6, 2003

(51) Int. Cl.[7] .............................................. H01L 23/62
(52) U.S. Cl. ...................... 257/355; 257/355; 257/362; 257/363; 361/690
(58) Field of Search ................................ 257/355, 362, 257/363; 361/690

(56) References Cited

U.S. PATENT DOCUMENTS

| | | |
|---|---|---|
| 5,537,284 A | 7/1996 | Haas, Jr. et al. |
| 5,689,133 A | 11/1997 | Li et al. |
| 6,034,388 A | 3/2000 | Brown et al. |
| 6,153,913 A | 11/2000 | Hsu et al. |
| 6,157,530 A | 12/2000 | Pequignot et al. |
| 6,259,139 B1 | 7/2001 | Pan |
| 6,262,873 B1 | 7/2001 | Pequignot et al. |
| 6,268,286 B1 | 7/2001 | Gauthier, Jr. et al. |
| 6,292,343 B1 | 9/2001 | Pequignot et al. |
| 6,331,726 B1 | 12/2001 | Voldman |
| 6,353,236 B1 | 3/2002 | Yatsuo et al. |
| 6,436,744 B1 | 8/2002 | Bryant et al. |
| 6,560,105 B1 * | 5/2003 | Roy et al. .................... 361/690 |
| 6,674,129 B1 * | 1/2004 | Colclaser et al. ........... 257/355 |
| 6,734,093 B1 | 5/2004 | Sabin et al. |

2002/0070424 A1 6/2002 Uenishi

OTHER PUBLICATIONS

Test Structures for Benchmarking the Electrostatic Discharge (ESD) Robustness of CMOS Technologies, Sematech, Inc., Feb. 27, 1998.

Characterization, Modeling, and Design of ESD Protection Circuits, Stephen G. Beebe, Advanced Micro Devices, Mar. 1998.

Investigation of ESD Performance in Advanced CMOS Technology, A dissertation Submitted to the Department of Electrical Engineering and the Committee on Graduate Studies of Stanford University in Partial Fulfillment of the Requirements for the Degree of Doctor of Philosophy, Kwang–Hoon Oh, Oct. 2002.

Lighting Rods for Nanoelectronics, Steven H. Voldman, *Scientific American*, vol. 287, No. 4, pp. 90–97, Oct. 2002.

* cited by examiner

*Primary Examiner*—David Nelms
*Assistant Examiner*—Mai-Huong Tran
(74) *Attorney, Agent, or Firm*—Myers Dawes Andras & Sherman, LLP (57) ABSTRACT

A method and apparatus for preventing thermo-mechanical damage to an electrostatic discharge (ESD) protection device is disclosed. The method and apparatus of the invention focus on preventing ESD protection circuit failure due to elastic waves within the materials of an integrated circuit. The elastic waves are specifically caused by very fast ESD discharge events. Disclosed are ESD protection circuits incorporating materials with superior thermo-mechanical properties, in particular, material damping, melting temperature, material stiffness, elastic modulus, tensile strength and fracture toughness. Also disclosed is the use of thermo-mechanical energy absorber material that is designed to protect ESD devices from failure due to slower ESD events.

27 Claims, 5 Drawing Sheets

METHOD AND APPARATUS FOR PREVENTING MICROCIRCUIT DYNAMIC THERMO-MECHANICAL DAMAGE DURING AN ESD EVENT

BACKGROUND OF THE INVENTION

1. Field of the Invention

The present invention pertains generally to microelectronic devices, and specifically, to circuit and network configurations designed to reduce the harmful effects of electrostatic discharge in such devices. More particularly, the present invention relates circuit and network configurations and methods resistant to very fast electrostatic discharge events.

2. Description of the Related Art

Electrostatic Discharge (ESD) is a significant problem in microelectronic devices. ESD damage results from high voltage and/or current applied to the terminals of microelectronic devices by human or machine contact during device manufacturing, assembly transportation/storage or PC board mounting. The voltage and current spikes are typically of a very short duration and can cause breakdown of such devices, thus rendering them inoperable. This is a problem of increasing importance as smaller and smaller device dimensions render them more susceptible to damage.

To protect microelectronic devices from the harmful effects of ESD, dedicated ESD protection circuits are commonly employed. Typically, such circuits are designed to divert ESD pulses from the device without affecting its performance under normal operating conditions. The protection circuit itself should be able to survive the ESD pulse. Nonetheless, in practice ESD impulses often destroy both the protection circuit and the protected device, even with ESD protection devices designed using state-of-the-art methods.

One of the underlying reasons for failure of prior art ESD protection devices is that their design is based on an incomplete understanding of the mechanisms by which an ESD pulse destroys the device. It is commonly understood in the prior art that the damage due to ESD pulses happens via:

1. Electrical breakdown of electronic structure due to high current that changes operating characteristics of the device; followed by
2. Thermal breakdown, wherein the high temperature induced by the pulse causes local current instabilities (e.g. current filamentation) and consequently melting of the semiconductor, contacts and/or other elements of the device.

For ESD protection circuits, it is the thermal breakdown that is typically used as the design criterion. However, experimental evidence indicates that there must exist other phenomena that contribute to failure of ESD protection circuits even before the melting point has been reached. This is confirmed by poor reliability and unpredictable performance of ESD protection circuits designed according to the prior art.

Accordingly, in view of the problems and deficiencies of the prior art, a need exists to improve the reliability and performance of ESD protection devices, and improve the survivability of microelectronic devices subjected to ESD events. In addition, it is important that such an improved approach be relatively inexpensive to implement.

SUMMARY OF THE INVENTION

The present invention provides an integrated circuit incorporating an Electrostatic Discharge (ESD) protection device comprising a semiconductor substrate; an electrical contact pad; an ESD switch coupled to the pad and having an active device region formed in the semiconductor substrate. The present invention further includes a dynamic shock absorbing region formed in the semiconductor substrate adjacent to the active device region, the dynamic shock absorbing region is made from a material with thermo-mechanical properties substantially more resistant to shock from dynamic effects of ESD than the active device region. The thermo-mechanical properties include a dynamic loss factor higher than approximately 0.01, a melting temperature higher than approximately 800°K, and a moderately low stiffness as defined by an elastic modulus approximately in the range of 10 GPa to 100 GPa (Giga Pascals), and a tensile strength higher than approximately 100 MPa.

In a preferred embodiment, the ESD switch of the present invention has one or more sides, wherein the dynamic shock absorbing region formed in the semiconductor substrate is located in trenches adjacent to the one or more sides of the ESD switch. Alternatively, the dynamic shock absorbing region is configured above, or below the active device region of the ESD switch. The dynamic shock absorbing region is made from a material with thermo-mechanical properties substantially more resistant to dynamic shock than the active device region and may be selected from the group consisting of hard polymers, amorphous carbon, carbon-carbon composite or carbon-polymer composite. Alternatively, the dynamic shock absorbing region is surrounded by a dielectric region.

In another aspect, the present invention is an integrated circuit incorporating an Electrostatic Discharge (ESD) protection device comprising a semiconductor substrate; an ESD switch having an active device region formed in the semiconductor substrate; and a plurality of dynamic shock absorbing regions formed around the active device region. The dynamic shock absorbing region is made from a material with thermo-mechanical properties substantially more resistant to shock from dynamic effects of ESD than the active device region. The thermo-mechanical properties include a dynamic loss factor higher than approximately 0.01, a melting temperature higher than approximately 800°K, an elastic modulus approximately in the range of 10 GPa and 100 GPa (Giga Pascals), and a moderately high tensile strength higher than approximately 100 MPa. A preferred embodiment includes a dielectric layer formed in between the ESD switch and the dynamic shock absorbing region, and a passivation layer formed above the dynamic shock absorbing region.

The ESD switch may also include a gate region wherein the gate region is formed from a thermo-mechanical energy sink material, the thermo-mechanical energy sink material substantially more resistant to thermo-mechanical expansion than the semiconductor substrate. The thermo-mechanical energy sink material has physical properties including a thermal expansion coefficient lower than approximately $5 \times 10^{-6}$°$K^{-1}$, a melting temperature higher than approximately 2000°K, a tensile strength higher than approximately 300 MPa (Mega Pascals), and a fracture toughness approximately higher than about 1.0 MPa m$^{1/2}$. A preferred embodiment of the present invention further includes a second dynamic shock absorbing region formed in the semiconductor substrate in thermal contact with the active device region, the second dynamic shock absorbing region made from a material with thermo-mechanical properties substantially more resistant to shock from the dynamic effects of ESD than said active device region. Alternatively, the ESD switch further comprises a third dynamic shock absorbing region located adjacent to one or more sides of the ESD switch.

In another aspect, the present invention is an integrated circuit incorporating an Electrostatic Discharge (ESD) protection device comprising a semiconductor substrate; an ESD circuit comprising a switch having an active device region formed in the semiconductor substrate and one or more passive circuit components; and means for absorbing dynamic shock from at least one of the switch and one or more passive components in response to an ESD event. The means for absorbing shock may comprise a region above the active device region made from a material with thermo-mechanical properties resistant to shock from dynamic effects of ESD. Alternatively, a second dynamic shock absorbing region is formed below the active device region, the second dynamic shock absorbing region is made from a material with thermo-mechanical properties resistant to shock from the dynamic effects of ESD. Similarly, a third dynamic shock absorbing region may be formed adjacent to the one or more sides of the ESD switch.

The present invention is further a method of fabricating an ESD device on a semiconductor substrate, the method comprising fabricating a switch from connectors and active device regions formed in the semiconductor substrate; providing a dynamic shock absorbing region formed in the semiconductor substrate adjacent to said active device regions. As in previous embodiments, the dynamic shock absorbing region is made from a material with thermo-mechanical properties substantially resistant to shock from dynamic effects of ESD.

Further objects, advantages and features of the present invention will become apparent to those skilled in the art from the following detailed description, when read in conjunction with the accompanying drawings.

DETAILED DESCRIPTION OF THE INVENTION

First, the modeling of ESD damage underlying the approach of the present invention will be described.

There are three basic models conventionally used to describe different types of ESD events: the Human Body Model (HBM), the Machine Model (MM) and the Charged Device Model (CDM). The Human Body Model, representative of a charged person touching the electronic device, assumes that a human is charged to around several kilovolts (KV) and is represented by a capacitance of about several hundred Pico Farads that can discharge through a resistor of a few kilo ohms. For example, such an arrangement can generate a 4 KV pulse with a maximum current of 2.6 A and about 150 ns event time. The Machine Model, representative of a charged tool touching the device as a typical example, assumes that a 400 V pulse is discharged with a maximum current of 7 A and an event duration of 10 to 50 ns. In the Charged Device Model corresponding to contact or grounding of charged devices, the event time is extremely short (about 0.25 ns) with voltages reaching about 1 KV and currents on the order of 10 A.

As discussed above, prior approaches to modeling ESD and designing ESD protection focus on electrical breakdown and melting due to localized high currents. Such approaches fail to appreciate and compensate for a different class of microelectronic device damage due to ESD. In particular, the present inventors have discovered that ESD damage also occurs through a thermo-mechanical mechanism as described below. This discovery was confirmed through analytical and numerical ESD event simulations incorporating mechanical deformation analysis of the device structure.

1. ESD discharge causes very fast local heating, which occurs within relatively small volumes. The local heating causes, through thermal expansion of materials, intense mechanical stress and deformation. Such effects will typically occur in all three types of ESD events; i.e. HBM, MM and CDM events.

2. Depending upon the rate of temperature increase, mechanical vibrations or elastic waves may be triggered in the device, further compounding mechanical stress intensity. These effects will typically become more significant for fast ESD events such as MM events and in particular, CDM events.

The stress intensity caused by thermo-mechanical effects 1, and 2, may surpass the strength of the integrated circuit (IC) chip materials and/or interfaces between different layers, leading to plastic deformation, cracking and/or delamination within the chip. The cracks provide an additional barrier to current flow and/or heat dissipation in consecutive ESD events and thus compound the destructive effects. These thermo-mechanical mechanisms can destroy chips, or begin a process of destruction of chips, at temperatures well below the melting point recognized in the prior art.

Figure 1:
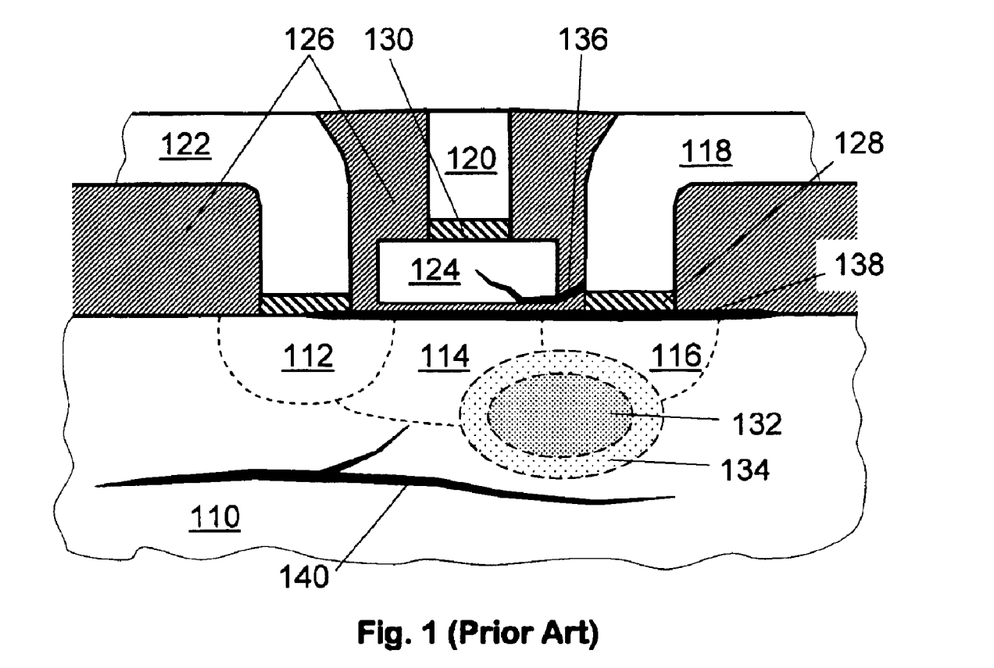
FIG. 1 is an illustration of a prior art integrated circuit incorporating an electrostatic discharge (ESD) protection device that has undergone thermo-mechanical damage due to a fast ESD event.

More specifically, referring to FIG. 1, the primary areas and types of thermo-mechanical damage that can be caused by effects 1, and 2, above during a very fast ESD event are illustrated. The ESD protection device of FIG. 1 is a typical example of a MOSFET switch used in an ESD protection circuit. The MOSFET switch is formed in substrate 110, part of an IC substrate typically of single crystal silicon. The gate contact 120 and drain contact 118 (or source 122) are coupled to the IC pad and ideally the switch will turn on and shunt ESD current harmlessly to ground in an ESD event on the pad. By way of reference, as will be appreciated by those skilled in the art, the components of the MOSFET device also include, source 112, channel 114, drain 116, gate 124, and dielectric material 126. The connectors are typically aluminum or aluminum-silicon-copper alloy and the dielectric is typically silicon dioxide ($SiO_2$). A thin contact diffusion barrier 128 (e.g. titanium nitride TiN) is also shown. The types of thermo-mechanical damage illustrated include delamination 138 and separation of connectors 118, 120, 122 and other elements of the device. Also leading to thermo-mechanical failure is crack propagation 136 from high-stress areas, especially from connectors 118, 120, 122, and adjacent etched or deposited areas formed during fabrication. Crack propagation also occurs in the (silicon) substrate 110 due to dynamic oscillations and elastic waves induced by fast heating. Another type of damage is plastic deformation 134 of the substrate 110 around the heated area epicenter 132 with resulting destruction of its single-crystal structure. The elastic waves induced by fast heating can also cause damage (not shown) further from the heating area 132.

The present invention provides circuit designs and methods that minimize the thermo-mechanical effects of ESD discharge, particularly thermo-mechanical damage due to fast ESD discharge on the components of the ESD device.

Figure 2:
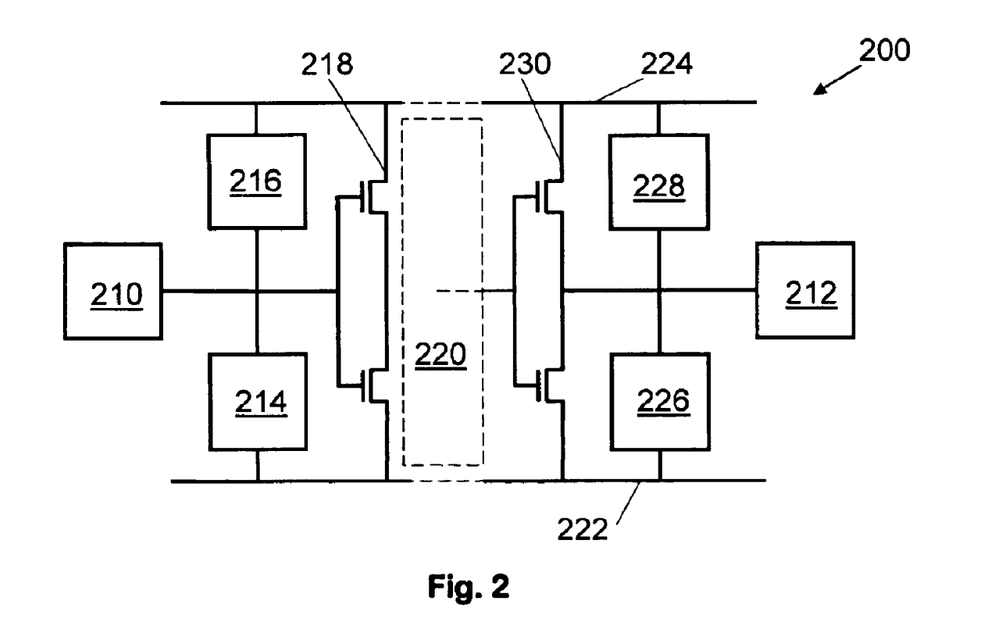
FIG. 2 is a circuit block diagram of a microelectronic circuit employing improved ESD protection in accordance with the present invention.
Figure 4:
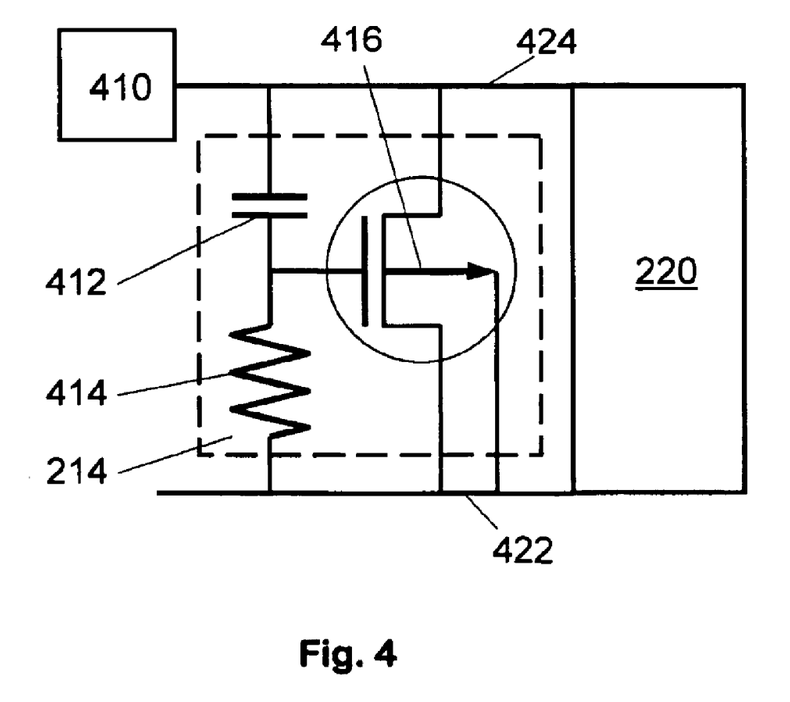
FIG. 4 is a schematic drawing of another microelectronic circuit layout employing improved ESD protection in accordance with the present invention.

In FIG. 2, a block diagram of a microelectronic circuit 200 having improved ESD protection in accordance with the present invention is illustrated. The circuit 200 may comprise any type of microelectronic circuit requiring ESD protection and will typically comprise an IC having core circuitry 220 having many thousands or millions of devices on an IC substrate. Input/output ESD protection circuitry 214, 216, 226, 228 protects the core circuitry 220 from ESD pulses applied to pads 210, 212. The protection circuitry shields the I/O buffers 218, 230 from the stress by clamping the voltage at 110 pads 210, 212 below the breakdown level. At the same time, the protection circuitry effectively shunts the ESD current to the ground 222 without going through internal circuitry 220. A variety of devices, such as diodes, bipolar transistors, SCRs or MOSFETs can be used in circuitry 214, 216, 226 and 228, usually in conjunction with resistors, as efficient input protection switches. One specific switch configuration is shown in FIG. 4. The present invention is not limited to a specific switch, however, since the main purpose of any switch is to release the ESD energy into surrounding materials where it can be dissipated. Hence, the thermo-mechanical damage modes shown above and respective remedies discussed below, apply to any such switch. Similarly, the modifications can be applied to other components of the ESD protection circuit, such as capacitor 412 and resistor 414.

Figure 3:
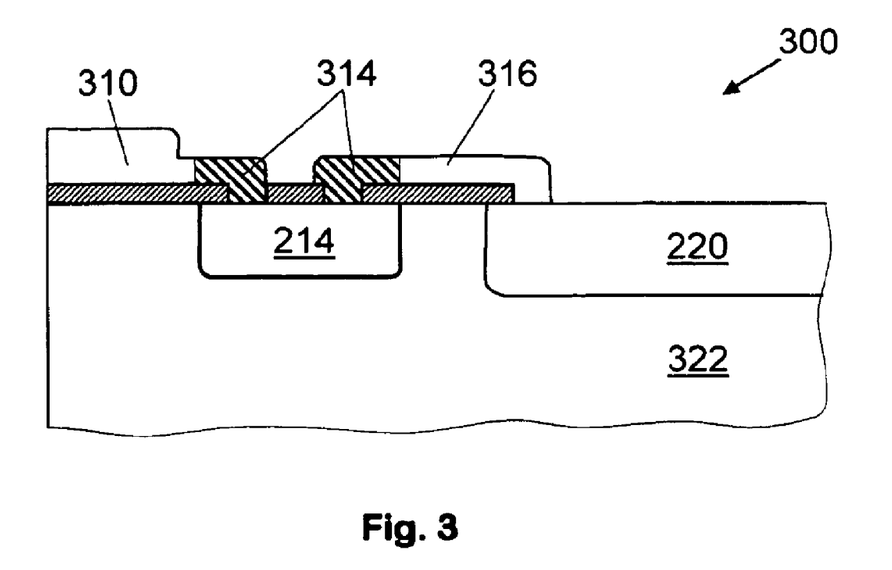
FIG. 3 is an illustration showing a vertical portion of a cross section of the microelectronic circuit of FIG. 2.

FIG. 3 illustrates generally the physical arrangement of an ESD protection circuit 214 in relation to the IC substrate. The figure shows a vertical cross section of a microelectronic circuit 200 implemented as an IC chip 300. The ESD protection circuit 214 is typically located below the input pad 310 and is spaced apart from the main circuitry 220 (usually at a distance of at least ten or more microns). IC substrate 322 may be single crystal silicon or other known IC substrate. The active devices in core region 220 will include doped regions in the substrate 322 as known in the art. For example, if they contain MOSFET devices, they may generally have the form shown in FIG. 1. Connectors 316 may be conventional materials such as aluminum or copper. Connectors 314, i.e. the portion of the electrical connection within a distance from the pad 210 subject to thermo-mechanical effects, may be a hybrid structure including at least a portion of a thermo-mechanical damage resistive material, as discussed below in relation in FIGS. 6 and 9.

FIG. 4 shows a specific example of an input protection circuit that uses a resistor 414 and a capacitor 412 along with an nMOS transistor 416. The nMOS transistor 416 acts as a switch and is off during normal operation. During an ESD event, the nMOS transistor 416 enters into the ESD protection mode, clamping the voltage on the pad 410 below the breakdown levels. The additional resistor 414 and capacitor 412 serve to adjust the breakdown voltage that activates ESD protection. Cross-referencing to FIGS. 2 and 3, the ESD protection circuit 214 may thus comprise transistor 416, resistor 414 and capacitor 412 in an embodiment.

The present invention includes specific focus to improve ESD resistance to very fast ESD events that cause dynamic shock effects (e.g. oscillations, elastic waves, dynamic crack propagation). Such dynamic shock effects caused by fast discharge are applicable to the CD model and some frequencies within HBM and MM, especially for larger devices. The present invention may also combine these approaches with an approach directed to improve ESD resistance to slower ESD events, which relates to thermo-mechanical failure under all conditions (i.e. HBM, MM, CDM). This approach is disclosed in detail in the U.S. Patent Application entitled: Method And Apparatus for Preventing Microcircuit Thermo-Mechanical Damage During An ESD Event, filed contemporaneously herewith, and by the same inventors as the present invention, which is incorporated by reference herein, in its entirety.

To minimize propagation of the dynamic effects due to fast thermal expansion, the present invention provides in the vicinity of the heated area a "shock absorber" or a number of shock absorbers that will absorb the energy of dynamic effects. The shock absorbing material of the present invention can be in either of the following three classes:

1. Damping materials, with the following properties:
   a. High material damping coefficient that dissipates mechanical energy. The desired range of material damping is defined by the value of the Dynamic Loss Factor that is the ratio of the mechanical energy dissipated during one cycle to the maximum strain energy during the cycle. According to the invention, shock-absorbing material should have a loss factor higher than approximately 0.01, more preferably higher than 0.04.
   b. Moderate melting temperature defined by a Melting Point above approximately 800 K.
   c. Moderately low stiffness as compared to silicon defined by a preferred Modulus of Elasticity between approximately 10 GPa (Giga Pascals) and 100 GPa.
   d. Moderate to high strength defined by a Tensile Strength higher than approximately 100 MPa.

Examples of desirable damping materials for shock absorbing material are: polymers and amorphous carbon.

2. High-Strength materials with the following properties:
   a. Modulus of Elasticity that is higher than approximately 100 GPa.
   b. Tensile Strength for bulk material (samples of cross-section of 2 mm or higher), the tensile strength preferably higher than approximately 300 MPa.
   c. Fracture Toughness that is higher than approximately 1.0 MPa m$^{1/2}$.

Examples of desirable high-strength materials for shock absorbers are: diamond, hard carbon (also known as diamond-like carbon, amorphous carbon), boron nitride, and silicon carbide.

3. Dynamic shock absorbers can be made as a composite that includes Damping Materials and High-Strength Materials.

It should be noted that material properties usually change with temperature—for example material strength typically decreases as melting temperature is approached. Hence, while it is desirable that the materials maintain the specified properties at the whole range of operating temperatures, the values given in this application refer to standard measurements at room temperature.

Figure 5:
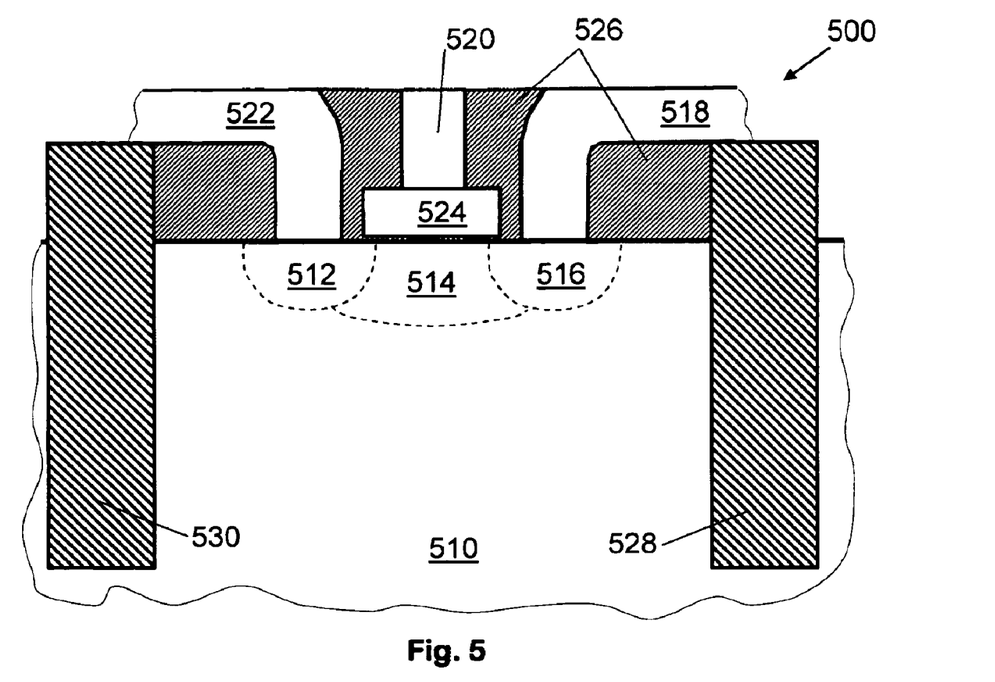
FIG. 5 is an illustration showing a vertical cross section of an ESD protection circuit in accordance with a first embodiment of the present invention where a dynamic shock absorber layer is inserted into the sides of the silicon device.

A preferred embodiment showing a manner in which shock absorbers 528, 530 are employed in an ESD device 500 is shown in FIG. 5. It should be noted that the preferred embodiments disclosed herein could be employed in various combinations. The specific structure corresponds to a MOSFET switch such as switch 416 shown in FIG. 4. However, the modifications can equally be applied to any other switch type, such as bipolar transistor, SCR or other known ESD switch type. By way of example, the active device region of an ESD switch comprises a source 512 and a drain 516 region connected by a channel 514 region, formed in substrate 510. The switch also has a gate 524 and dielectric 526. Connecting the active device regions are source 522, gate contact 520 and drain 518 connectors.

In the embodiment illustrated in FIG. 5, shock absorbers 528, 530 are inserted into deep grooves in the silicon on both sides of the device. This particular embodiment can be accomplished by anisotropic etching in the substrate 510, followed by isotropic deposition of a shock absorbing material (e.g. carbon) followed by an anisotropic planarizing etch. If needed, shock-absorbing material can be surrounded by dielectric material (not shown) such as Silicon Oxide or Silicon Nitride.

Figure 6:
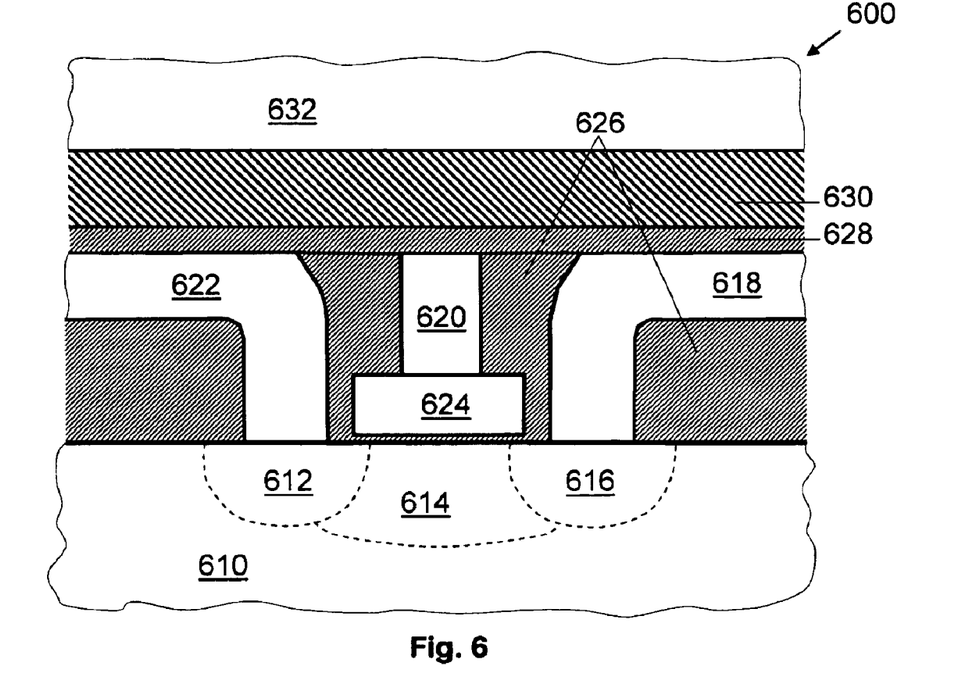
FIG. 6 is an illustration showing a vertical cross section of an ESD protection circuit in accordance with another embodiment of the present invention wherein a dynamic shock absorber is inserted above the device.

Another embodiment is represented in FIG. 6. The embodiment of FIG. 6 also shows a MOSFET switch comprising source 612, channel 614, drain 616, formed in substrate 610, associated source and drain contacts 618, 622, gate 624, gate contact 620 and dielectric 626. In this embodiment a shock absorber layer 630 is inserted below a passivation layer 632 and above the remaining portion of the ESD protection device 600. Again, if needed a thin dielectric layer 628, such as Si Oxide or Si Nitride, is introduced between the shock absorber 630 and the remainder of the device 600. As a special case, the entire passivation layer 632 is made of shock absorber material. The embodiment of FIG. 6 also includes a gate region 624 made of material resistant to thermo-mechanical expansion due to local heating from discharges with slower event times such as those modeled by the HBM and MM.

Figure 7:
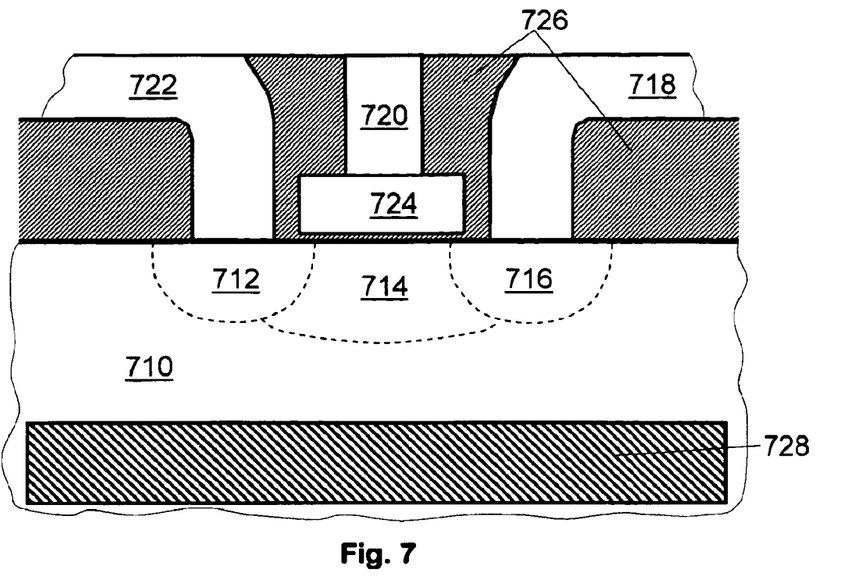
FIG. 7 is an illustration showing a vertical cross section of an ESD protection circuit of the present invention wherein a dynamic shock absorber is included in the substrate below the device.

Yet another embodiment is represented in FIG. 7. The embodiment of FIG. 7 illustrate a MOSFET switch comprising source 712, channel 714, and drain 716 formed in substrate 710 and associated contacts 722, 718, a gate 724, gate contact 720 and dielectric 726. In this embodiment, a shock absorber 728 is placed within the semiconductor substrate 710 below the active area of the ESD switch comprising the source, channel and drain regions. The active area of the ESD switch also may be defined as the area within the switch where the electric field is substantially non-zero. The shock absorber 728 may be located below each individual switch or stretch under a number of switches on an ESD protection pad. As in previous embodiments, the shock-absorbing layer 728 can be surrounded by a dielectric such as Si Oxide or Si Nitride if needed.

Figure 8:
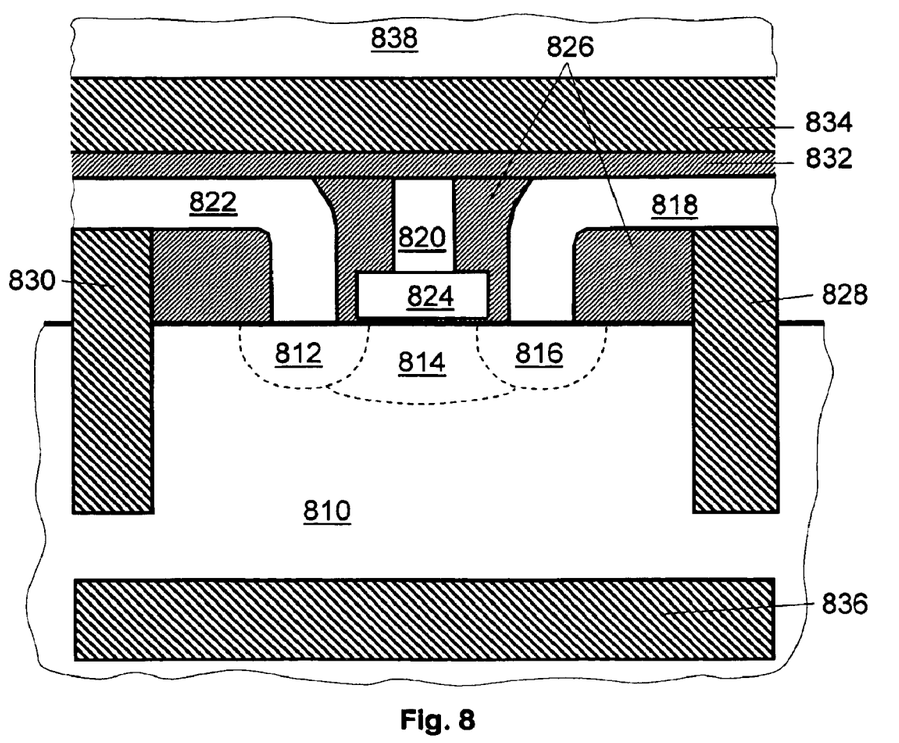
FIG. 8 is an illustration showing a vertical cross section of an ESD protection circuit in accordance with another embodiment of the present invention wherein previous examples are combined to essentially surround the entire ESD protection switch.

Another embodiment is illustrated in FIG. 8. As in the previous embodiments, a MOSFET switch comprising source 812, channel 814, drain 816, formed in substrate 810, drain contact 818, source contact 822, gate 824, gate contact 820 and dielectric 826. A dielectric layer 832 and passivation layer are also shown as in the prior embodiment. In the embodiment shown in FIG. 8, the shock absorbers 828, 830, 834, and 836 as shown in previous examples are combined to essentially surround the entire ESD protection switch and/or its components that may include individual MOSFETS, diodes, and resistors, etc. If needed, a connection is left between the active area and bulk semiconductor 810 to allow release of current to the ground.

Another embodiment is shown of a MOSFET switch surrounded by shock absorber 928, 930, 934 and 936. The FIG. 9 embodiment combines these dynamic shock absorber materials with material resistant to thermo-mechanical expansion applicable to the HBM and MM models. For these slower ESD modes, the mechanism of failure is through thermal expansion of materials and associated intense mechanical stress and deformation. The basic idea for preventing ESD device failure due to slower discharge events is to replace vulnerable materials (aluminum, copper, silicon) with thermo-mechanical energy sink material that can withstand thermo-mechanical expansion and stress. Ideally, the materials resistant to thermo-mechanical expansion have the following physical properties, in comparison to materials presently used.

1. Very low thermal expansion. This minimizes the thermal stresses and the dynamic energy induced by fast heating. The less thermal expansion, the less thermo-mechanical stress.
2. High strength and, preferably, low brittleness.
3. High melting temperature. Although this is not directly related to the thermo-mechanical damage mechanisms described here, it is generally desirable for such materials to have high melting temperature, to effectively resist the currently recognized "melting" mechanism of failure under ESD discharge.

Figure 9:
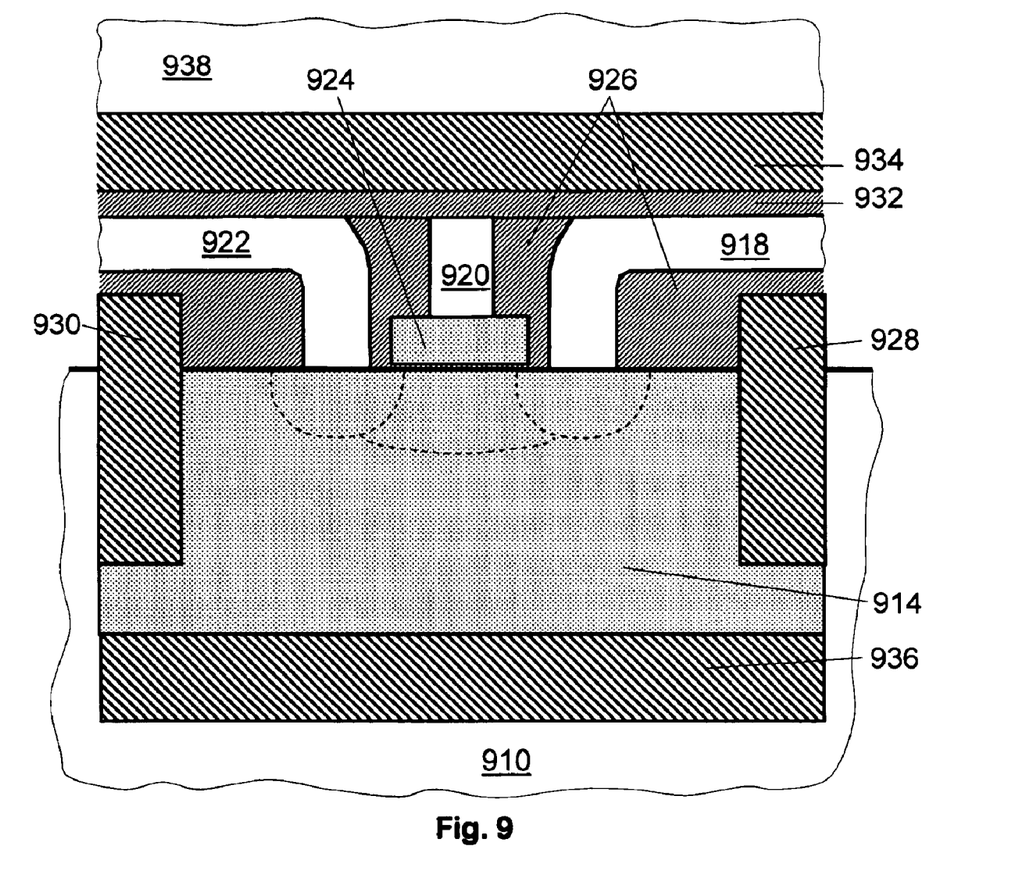
FIG. 9 is an illustration showing a vertical cross section of an ESD protection circuit in accordance with another embodiment of the present invention wherein the integrated circuit employs dynamic shock absorber material and also material resistant to thermo-mechanical stress.

As will be appreciated by those skilled in the art, different material types are used to perform different functions in ESD switches for a particular IC. Therefore, the desired "low" or "high" material properties are relative, depending on the materials commonly used in the application which are replaced for increased thermo-mechanical failure resistance. Specific examples will be provided below to clarify these material properties although these should not be viewed as limiting in nature. Referring to FIG. 9, the connectors 918, 920, and 922, should be fabricated from material with the following properties.

1. Low thermal expansion that is defined by the Coefficient of Thermal Expansion (CTE) being lower than $10.0 \times 10^{-6} °K^{-1}$ (per degree Kelvin) and, more preferably, lower than $5.0 \times 10^{-6} °K^{-1}$.
2. High melting temperature that is defined by a melting point being higher than 1500°K and, more preferably, higher than 3000°K.
3. High strength that is defined by the Tensile Strength for bulk material (samples that have cross-section of 2 mm or higher) being higher than 200 MPa (Mega Pascals) and a Fracture Toughness being higher than 1.0 MPa $m^{1/2}$. It should be noted that the strength criterion is of lesser importance for connectors than the other two criteria.

Examples of desirable connector materials are titanium nitride (TiN), graphite, and carbon (C). Alternatively, connectors 918, 920, 922 may comprise an alloy containing significant portions of such material used in conjunction with aluminum or copper.

In this embodiment, aluminum (Al) or copper (Cu) connectors 918, 920, 922 in the vicinity of the heated area are replaced by a conductor with high resistance to thermo-mechanical stress as defined above. As a result, a hybrid connector structure is formed as Al or Cu connectors 918, 920, and 922 are still used in the present invention to facilitate connections with the core circuitry and external wires (not shown). In relative terms, the thickness of the material (e.g. TiN, graphite or C) used in connectors 918, 920, 922, for example, should be approximately one half of the length of the active device region. In absolute terms, the thickness of the layer can vary from 50 A to 5,000 A; however, this range may easily change henceforth, because microelectronic devices continually get smaller with advancement.

The active area 914 of the semiconductor substrate 910, and the components such as resistors and capacitors therein, should be fabricated from material resistant to thermo-mechanical expansion with the following physical properties.

1. Low thermal expansion that is defined by the Coefficient of Thermal Expansion (CTE) being lower than $5.0 \times 10^{-6} °K^{-1}$, more preferably lower than $2.0 \times 10^{-6} °K^{-1}$, and ideally lower than $0.5 \times 10^{-6} °K^{-1}$.
2. High melting temperature that is defined by Melting Point being higher than 2000°K and, more preferably, higher than 3500°K.
3. High strength that is defined by Tensile Strength for bulk material (samples of cross-section of 2 mm or higher) being higher than 300 MPa (Mega Pascals) and Fracture Toughness being higher than 1.0 MPa $m^{1/2}$. More preferably, a tensile strength of bulk material above 600 MPa and fracture toughness above 3.0 MPa $m^{1/2}$ is desired.

Some examples of preferred semiconductor, resistor and capacitor materials include: diamond, hard carbon (i.e. diamond-like carbon, amorphous carbon), boron nitride, and less preferably, silicon carbide. All materials may be doped as needed for electrical properties.

Fabrication processes for an ESD protection device with improved resistance to thermo-mechanical stress are also provided by to the present invention. A first fabrication process is a method for inserting a material with desirable thermo-mechanical properties, such as hard carbon or diamond-like carbon, amorphous carbon, boron nitride, silicon carbide, or polymers, under the ESD protection switch. The method first employs depositing an oxide layer onto a semiconductor substrate. The next step is to deposit the material, e.g. hard carbon, onto the oxide layer at a predetermined thickness. Next, a photo resist layer is deposited on the substrate that forms the area where the ESD switch is located (i.e. adjacent to the region of the IC where the pad(s) will be formed). The remaining portions where the hard carbon and oxide layer were deposited are next etched away to leave the area where the ESD switch is to be located. Another oxide layer is then deposited on the hard carbon on the area of interest followed by another photo resist layer. The excess portions are again etched leaving the hard carbon encapsulated in oxide with a strip of silicon neighboring the enveloped hard carbon. Next, amorphous silicon is then deposited into the envelope followed by an epitaxial silicon layer wherein the active region of the ESD switch is formed. Lastly, the excess amorphous silicon and unneeded oxide are etched from the rest of the wafer. The foregoing fabrication method may be applied to the embodiment discussed in FIGS. 7–9, for example.

A second method of the invention provides for surrounding an ESD protection switch area with a trench and filling the trench with a material resistant to dynamic shock (e.g. hard carbon). The first step is to apply a photo resist layer around and area to be etched away to form a trench. Next, an oxide layer and the hard carbon material are isotropically deposited into the trench. The excess hard carbon is then anisotropically reactive ion etched until only the trench is filled with hard carbon. Lastly, another oxide layer is deposited and etched leaving the hard carbon encapsulated in oxide. The foregoing fabrication method may be applied to the embodiment discussed in FIGS. 5, 8 and 9, for example.

Additional fabrication techniques are also contemplated by the present invention. First, the manufacturing of ESD devices should be achieved so that mechanically strong bonds are formed between the different materials contained within the device. Specific deposition techniques, for example, are employed to assure strong bonding between consecutive deposited layers.

A first technique is to use a uniform deposition temperature for all materials, appropriately near 400° C., for example. By using the same deposition temperature for all materials, the invention minimizes fabrication stresses between the material layers caused by different thermal expansion coefficients of materials. By choosing the deposition temperature to be between room temperature and that achieved during ESD, the present invention aims to optimize the range of thermal stresses so that they are not too high, either at room temperature or during an ESD event. The basic principle is that inter-layer thermal stresses increase with the departure from stress-free deposition temperature. Prolonged annealing is another technique to improve the strength and ductility of materials in the manufacturing of ESD devices. A preferred annealing temperature for exemplary materials of the present invention is approximately 600° C.

An additional manufacturing and design technique is to eliminate sharp corners when fabricating and etching the components of the ESD device. By using appropriate deposition and etching techniques, sharp corners between adjoining materials should be minimized in favor of rounded corners. Generally, the geometry of corners and notches should be as smooth as practically achievable to minimize the mechanical stress at which crack propagation occurs. An alternative technique contemplated by the present invention is to apply a passivation layer that is stiff and strong with an optimal thickness. A strong passivation layer will contain the expansive thermal stresses and maintain them within the compressive, rather than tensile, range. This helps prevent delamination, material separation and crack propagation. Further, the passivation layer should be ductile, rather than brittle, to prevent the layer from cracking and provide some damping of elastic waves caused by fast ESD events.

It should be appreciated that the foregoing description of the preferred embodiments of the present invention may be modified in a variety of different ways, which should be apparent to those skilled in the art from the above teachings. Accordingly, the present invention should not be limited in any way to the illustrated embodiments as the present invention in its various aspects encompasses all such modifications and variations thereof which are too numerous to describe in specific detail herein. While the invention has been illustrated and described by means of specific embodiments, it is to be understood that numerous changes and modifications may be made therein without departing from the intent and scope of the invention as defined in the appended claims.

What is claimed is:

1. An integrated circuit incorporating an Electrostatic Discharge (ESD) protection device comprising:

a semiconductor substrate;

an electrical contact pad;

an ESD switch coupled to the pad and having an active device region formed in the semiconductor substrate; and a dynamic shock absorbing region formed in the semiconductor substrate adjacent to said active device region, said dynamic shock absorbing region made from a material with thermo-mechanical properties substantially more resistant to shock from dynamic effects of ESD than said active device region, wherein said thermo-mechanical properties include a dynamic loss factor higher than approximately 0.01.

2. An integrated circuit incorporating an Electrostatic Discharge (ESD) protection comprising:

a semiconductor substrate;

an electrical contact pad;

an ESD switch coupled to the pad and having an active device region formed in the semiconductor substrate; and a dynamic shock absorbing region formed in the semiconductor substrate adjacent to said active device region, said dynamic shock absorbing region made from a material with thermo-mechanical properties substantially more resistant to shock from dynamic effects of ESD than said active device region, wherein said thermo-mechanical properties further include a melting temperature higher than approximately 800° K.

3. An integrated circuit incorporating an Electrostatic Discharge (ESD) protection comprising:

a semiconductor substrate;

an electrical contact pad;

an ESD switch coupled to the pad and having an active device region formed in the semiconductor substrate; and a dynamic shock absorbing region formed in the semiconductor substrate adjacent to said active device region, said dynamic shock absorbing region made from a material with thermo-mechanical properties substantially more resistant to shock from dynamic effects of ESD than said active device region, wherein said thermo-mechanical properties further include a moderately low stiffness as defined by an elastic modulus approximately in the range of 10 GPa and 100 GPa (Giga Pascals).

4. An integrated circuit incorporating an Electrostatic Discharge (ESD) protection comprising:

a semiconductor substrate;

an electrical contact pad;

an ESD switch coupled to the pad and having an active device region formed in the semiconductor substrate; and a dynamic shock absorbing region formed in the semiconductor substrate adjacent to said active device region, said dynamic shock absorbing region made from a material with thermo-mechanical properties substantially more resistant to shock from dynamic effects of ESD than said active device region, wherein said thermo-mechanical properties further include a tensile strength higher than approximately 100 MPa.

5. An integrated circuit incorporating an Electrostatic Discharge (ESD) protection device comprising:

a semiconductor substrate;

an ESD switch having an active device region formed in the semiconductor substrate; and a plurality of dynamic shock absorbing regions formed around the active device region, said dynamic shock absorbing region made from a material with thermo-mechanical properties substantially more resistant to shock from dynamic effects of ESD than said active device region, wherein said thermo-mechanical properties include a dynamic loss factor higher than approximately 0.01.

6. An integrated circuit incorporating an Electrostatic Discharge (ESD) protection device comprising:

a semiconductor substrate;

an ESD switch having an active device region formed in the semiconductor substrate; and a plurality of dynamic shock absorbing regions formed around the active device region, said dynamic shock absorbing region made from a material with thermo-mechanical properties substantially more resistant to shock from dynamic effects of ESD than said active device region, wherein said thermo-mechanical properties further include a melting temperature higher than approximately 800° K.

7. An integrated circuit incorporating an Electrostatic Discharge (ESD) protection device comprising:

a semiconductor substrate;

an ESD switch having an active device region formed in the semiconductor substrate; and a plurality of dynamic shock absorbing regions formed around the active device region, said dynamic shock absorbing region made from a material with thermo-mechanical properties substantially more resistant to shock from dynamic effects of ESD than said active device region, wherein said thermo-mechanical properties further include a moderately low stiffness as defined by an elastic modulus approximately in the range of 10 GPa and 100 GPa (Giga Pascals).

8. An integrated circuit incorporating an Electrostatic Discharge (ESD) protection device comprising:

a semiconductor substrate;

an ESD switch having an active device region formed in the semiconductor substrate; and a plurality of dynamic shock absorbing regions formed around the active device region, said dynamic shock absorbing region made from a material with thermo-mechanical properties substantially more resistant to shock from dynamic effects of ESD than said active device region, wherein said thermo-mechanical properties further include a moderately high tensile strength higher than approximately 100 MPa.

9. An integrated circuit incorporating an Electrostatic Discharge (ESD) protection device comprising:

a semiconductor substrate;

an ESD circuit comprising a switch having an active device region formed in the semiconductor substrate and one or more passive circuit components; and means for absorbing dynamic shock from at least one of the switch and one or more passive components in response to an ESD event, wherein said means for absorbing shock comprises a region above the active device region made from a material with thermo-mechanical properties resistant to shock from dynamic effects of ESD, the thermo-mechanical properties including a high material dynamic loss factor higher than approximately 0.01.

10. An integrated circuit incorporating an Electrostatic Discharge (ESD) protection device comprising:

a semiconductor substrate;

an ESD circuit comprising a switch having an active device region formed in the semiconductor substrate and one or more passive circuit components, wherein said switch has a gate region and wherein said gate region is formed from a thermo-mechanical energy sink material, said thermo-mechanical energy sink material being substantially resistant to thermo-mechanical expansion and having physical properties including a low thermal expansion coefficient lower than approximately $5 \times 10^{-6\circ} K^{-1}$; and means for absorbing dynamic shock from at least one of the switch and one or more passive components in response to an ESD event.

11. An integrated circuit incorporating an Electrostatic Discharge (ESD) protection device comprising:

a semiconductor substrate;

an ESD circuit comprising a switch having an active device region formed in the semiconductor substrate and one or more passive circuit components, wherein said active device region of said switch is formed from a thermo-mechanical energy sink material, said thermo-mechanical energy sink material substantially resistant to thermo-mechanical expansion and having physical properties including a low thermal expansion coefficient lower than approximately $5 \times 10^{-5} °K^{-1}$; and means for absorbing dynamic shock from at least one of the switch and one or more passive components in response to an ESD event.

12. The integrated circuit incorporating an Electrostatic Discharge (ESD) protection device according to claim 1, 2, 3 or 4, wherein the ESD switch has one or more sides, and wherein the dynamic shock absorbing region formed in the semiconductor substrate is located in trenches adjacent to the one or more sides of the ESD switch.

13. The integrated circuit incorporating an Electrostatic Discharge (ESD) protection device according to claim 1, 2, 3 or 4, wherein the ESD switch is a transistor.

14. The integrated circuit incorporating an Electrostatic Discharge (ESD) protection device according to claim 1, 2, 3 or 4, wherein the dynamic shock absorbing region is configured above the active device region.

15. The integrated circuit incorporating an Electrostatic Discharge (ESD) protection device according to claim 1, 2, 3 or 4, wherein the dynamic shock absorbing region is configured below the active device region of the ESD switch.

16. The integrated circuit incorporating an Electrostatic Discharge (ESD) protection device according to claim 1, 2, 3 or 4, wherein said dynamic shock absorbing region made from a material with thermo-mechanical properties substantially more resistant to dynamic shock than said active device region is selected from the group consisting of hard polymers, amorphous carbon, carbon-carbon composite or carbon-polymer composite.

17. The integrated circuit incorporating an Electrostatic Discharge (ESD) protection device according to claim 1, 2, 3 or 4, wherein said dynamic shock absorbing region is surrounded by a dielectric region.

18. The integrated circuit incorporating an Electrostatic Discharge (ESD) protection device according to claim 5, 6, 7 or 8, further comprising a dielectric layer formed in between said ESD switch and said dynamic shock absorbing region.

19. The integrated circuit incorporating an Electrostatic Discharge (ESD) protection device according to claim 5, 6, 7 or 8, and further comprising a passivation layer formed above said dynamic shock absorbing region.

20. The integrated circuit incorporating an Electrostatic Discharge (ESD) protection device according to claim 5, 6, 7 or 8, wherein said ESD switch has a gate region formed from a thermo-mechanical energy sink material, and wherein said thermo-mechanical energy sink material is substantially more resistant to thermo-mechanical expansion than the semiconductor substrate.

21. The integrated circuit incorporating an Electrostatic Discharge (ESD) protection device according to claim 20, wherein said thermo-mechanical energy sink material has physical properties including a high melting temperature higher than approximately 2000° K.

22. The integrated circuit incorporating an Electrostatic Discharge (ESD) protection device according to claim 20, wherein said thermo-mechanical energy sink material has physical properties further including a high tensile strength higher than approximately 300 MPa.

23. The integrated circuit incorporating an Electrostatic Discharge (ESD) protection device according to claim 20, wherein said thermo-mechanical energy sink material has physical properties further including a low thermal expansion coefficient lower than approximately $5 \times 10^{-6\circ} K^{-1}$.

24. The integrated circuit incorporation an Electrostatic Discharge (ESD) protection device according to claim 5, 6, 7 or 8, further comprising a second dynamic shock absorbing region formed in the semiconductor substrate in thermal contact with said active device region, said second dynamic shock absorbing region made from a material with thermo-mechanical properties substantially more resistant to shock from the dynamic effects of ESD than said active device region.

25. The integrated circuit incorporating an Electrostatic Discharge (ESD) protection device according to claim 5, 6, 7 or 8, wherein the ESD switch has one or more sides, the device further comprising a third dynamic shock absorbing region located adjacent to the one or more sides of the ESD switch.

26. The integrated circuit incorporating an Electrostatic Discharge (ESD) protection device according to claim 9, and further comprising a second dynamic shock absorbing region formed below the active device region, said second dynamic shock absorbing region made from a material with thermo-mechanical properties resistant to shock from the dynamic effects of ESD, the thermo-mechanical properties including a high material dynamic loss factor higher than approximately 0.01.

27. The integrated circuit incorporating an Electrostatic Discharge (ESD) protection device according to claim 26, wherein the ESD switch also has one or more sides, wherein the means for absorbing shock further comprises a third dynamic shock absorbing region formed adjacent to the one or more sides of the ESD switch, said third dynamic shock absorbing region made from a material with thermo-mechanical properties resistant to shock from the dynamic effects of ESD, the thermo-mechanical properties including a high material dynamic loss factor higher than approximately 0.01.

* * * * *